United States Patent [19]

Schnathorst et al.

[11] 4,409,680

[45] Oct. 11, 1983

[54] HIGH SPEED WRITE CONTROL FOR SYNCHRONOUS REGISTERS

[75] Inventors: Vernon K. Schnathorst, Monument; Gary T. Bastian, Colorado Springs, both of Colo.

[73] Assignee: NCR Corporation, Dayton, Ohio

[21] Appl. No.: 296,753

[22] Filed: Aug. 27, 1981

[51] Int. Cl.³ .......................... G11C 8/00; G11C 7/00
[52] U.S. Cl. ...................................... 365/233; 365/78; 365/190; 377/67; 377/79
[58] Field of Search ................. 365/78, 190, 233, 154; 307/221 R, 221 C; 328/63; 377/67, 79

[56] References Cited

U.S. PATENT DOCUMENTS

| | | | |
|---|---|---|---|
| 3,504,353 | 3/1970 | Guzak | 365/78 |
| 4,070,630 | 1/1978 | Hepworth et al. | 307/221 R |
| 4,090,256 | 5/1978 | Hepworth et al. | 365/154 |
| 4,338,679 | 7/1982 | O'Toole | 365/233 |

*Primary Examiner*—Stuart N. Hecker
*Attorney, Agent, or Firm*—J. T. Cavender; Philip A. Dalton; Casimer K. Salys

[57] ABSTRACT

An electronic circuit for regulating the entry of new data into a static synchronous register comprising a bank of D type, master-slave flip-flops. The circuit selectively passes the first phase of a two-phase, nonoverlapping clock signal used for synchronization and control of the data. A bootstrap operated, series pass, transistor configuration couples the first phase signal to the electrode actuating the master stage of each flip-flop. With provisions for the series pass transistor to transition into a conductive state prior to the onset of the first phase signal, the circuit ensures substantial replication of the first phase signal characteristics in terms of both time and amplitude.

4 Claims, 4 Drawing Figures

D TYPE FLIP-FLOP

HIGH SPEED WRITE CONTROL FOR SYNCHRONOUS REGISTERS

BRIEF SUMMARY OF THE INVENTION

The invention is related to a high speed WRITE control circuit for regulating the operation of a multiple line, synchronous register generally comprised of D type, master-slave flip-flops. The entry and storage of data is synchronized to a two-phase nonoverlapping clock. The first phase of the clock signals controls the entry of data into the master stage of each flip-flop. Consequently, in one form of practicing the invention, the first phase signal is selectively coupled through a series pass field effect transistor (FET) to an electrode commonly joining the master sections of the flip-flops. During operation of the series pass FET, its gate electrode is bootstrapped to an elevated voltage through the action of a second FET. The latter FET couples a source of WRITE command signals directly to the gate electrode of the series pass FET.

To initiate coupling of the first clock signal, and bootstrap operation of the series pass FET, the gate electrode of the second FET is continuously biased with a voltage substantially equal to the magnitude of the WRITE command signal. When the onset of the WRITE command signal is made to precede the onset of the first clock signal, the subsequently arriving first clock signal bootstraps the series pass FET and immediately passes therethrough. Thereby, the time and amplitude characteristics of the first clock signals are substantially replicated at the master stages of the register flip-flops.

DETAILED DESCRIPTION

The present invention in its broader sense deals with synchronous registers of the type generally utilized in digital computation and comprised of multiple flip-flops arranged in banks. With greater specificity, the embodied invention pertains to an electronic circuit for regulating the entry of new data into a bank of static, D type, master-slave flip-flops, in which the operation of the bank is synchronized to a two-phase, nonoverlapping clock signal.

Figure 1:
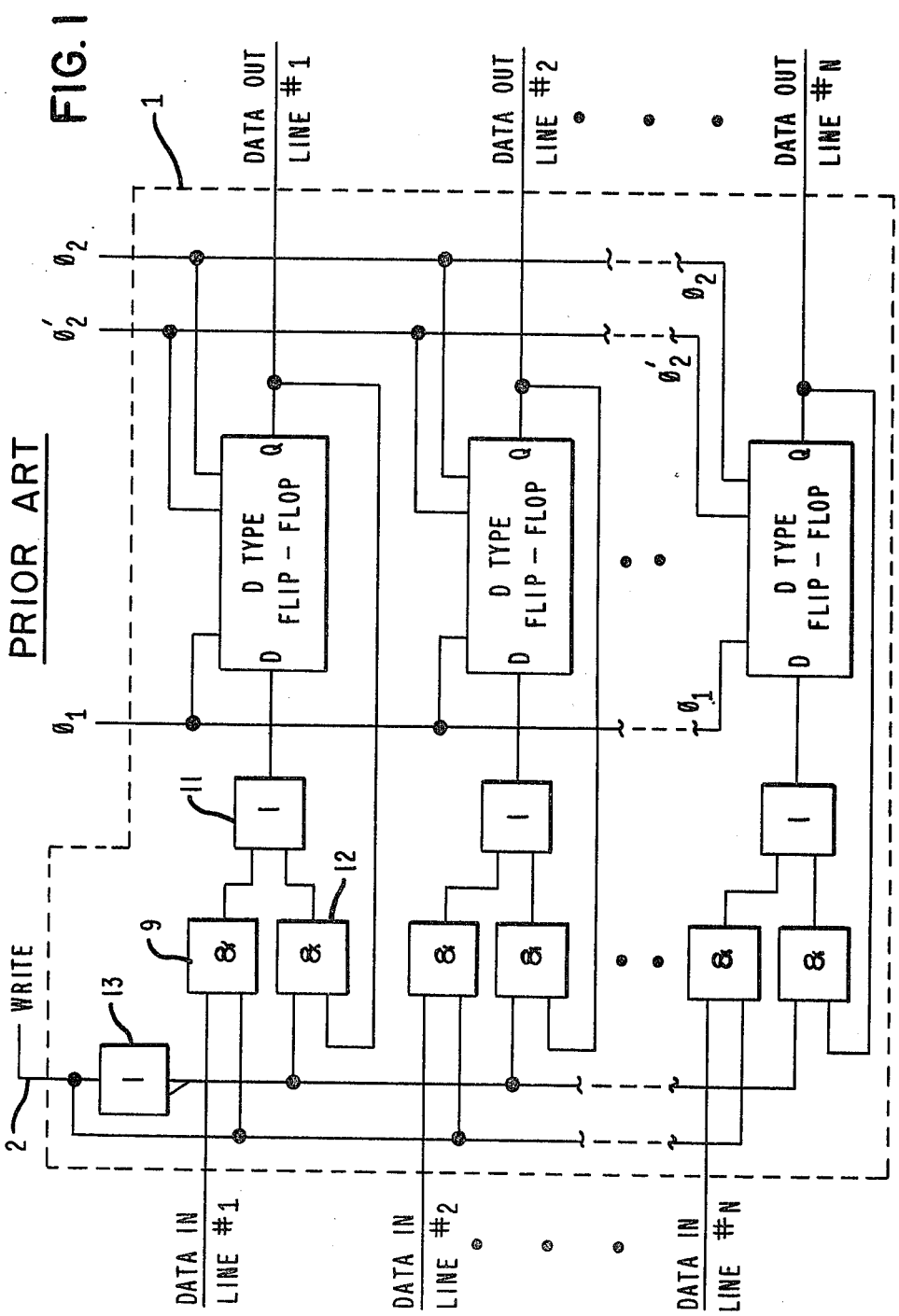
FIG. 1 schematically illustrates the form of a register generally known in the art.

Attention is now directed to FIG. 1 of the drawings, where a two-phase synchronous register of generally known organization is schematically illustrated. Data in binary format becomes available at DATA IN LINES 1-N and is entered into register 1 by a WRITE command. That data remains inviolate until a new entry is commanded by the presence of a succeeding signal on WRITE line 2. Consequently, data, once entered, remains in the register and on the DATA OUT LINES irrespective of the multiple cycling of the clock signals. In contrast, prior art registers configured with banks of D type, master-slave flip-flops retain the previously entered data by recirculating that data through control logic operated in synchronism with the clock signals.

Recognizing that each line in the synchronous register of FIG. 1 is substantially identical, it will suffice to analyze the elements of operation on any one line. Functionally, the composite register has an operation analogous to a multiple line binary sample and hold circuit. Structurally, note that each line of the register is coupled to the identical group of clock signals, $\phi_1$, $\phi_2$ and $\phi_2'$. The common connection of WRITE signal line 2 is also evident, though it is conceivable that multiple and distinct WRITE lines could be provided to data lines in groups.

Consider the essential features of a conventional D type flip-flop first. The basic device is well known by those practicing in the art as illustrated by the detailed description appearing in the text "Computer Hardware And Organization: An Introduction," authored by M. E. Sloan and published by Science Research Associates, Inc. For present purposes, the particular configuration of the flip-flop illustrated in FIG. 2 will serve merely as a convenient vehicle for understanding the overall operation of the prior art configuration, as well as one embodiment of the invention disclosed herein. The signals on lines $\phi_1$ and $\phi_2$ are classic two-phase, nonoverlapping, clock pulses, while the signal on line $\phi_2'$ is the $\phi_2$ clock sequence with a slight time delay. It may aid in the understanding to briefly refer to the voltage waveforms illustrated in FIG. 3, where representative examples of these signals are shown in relation to time. To understand the implementation of the flip-flops, in view of the foregoing, these circuits are further described to be comprised of n-channel, enhancement mode, field effect transistors (FETs), while the associated waveforms represent 0 and +5 volt extremes of the signal levels. The ensuing analysis of the D type flip-flop in its master-slave mode of operation will illustrate the important considerations.

Take time $t_3$ as a starting point, and presume the line entry at node D of the flip-flop to be at a +5 volt level, a binary "1." The +5 volt level of $\phi_1$ turns FET 3 "on" and drives the output of inverting amplifier 4 to a substantially zero level. Immediately after time $t_5$, FET 3 is turned "off." Soon thereafter, signal $\phi_2$ energizes FET 6 so as to provide the zero volt output from amplifier 4 to push-pull inverting amplifier 7. The output of the push-pull amplifier is routed back to the input of amplifier 4 when signal line $\phi_2'$ energizes FET 8. As one may deduce from the plots in FIG. 3, clock signal 100 $2'$ lags $\phi_2$ by a comparatively short time interval.

Capacitive effects within the various conductive paths of the flip-flop are both beneficial and detrimental. For instance, capacitance on the input line to inverting amplifier 4 maintains continuity at its output during the time interval between the termination of signal $\phi_1$ and the onset of the positive feedback loop through FET 8. On the other hand, capacitive effects do introduce propagation delays between the output of amplifier 4 and its latching, positive feedback signal. Were it not for the time delay between signal $\phi_2$ and $\phi_2'$, a capacitively retained output state on push-pull amplifier 7 would appear at the input to FET 4 by coupling through FET 8 coincident with a new state appearing at the input to push-pull amplifier 7. Stated otherwise, the delay introduced by $\phi_2'$ provides sufficient time for push-pull amplifier 7 to stabilize at the new level, before that level is returned to the input of amplifier 4 as a positive feedback latching signal. The output of push-pull amplifier 7 at node Q corresponds to the DATA OUT LINE of the register.

Undoubtedly it is recognized that the binary level at node D propagates through to node Q in synchronism with the clock signals. In the same context, to store binary data in the clocked, D type flip-flop described, node D must remain at the appropriate data level whenever the $\phi_1$ clock signal is present. Representative approaches in the prior art control the data presented to node D of the flip-flop by controlling the recirculation of previously entered data with logic circuitry suitable to detect the presence of a WRITE command and new data.

Returning to the prior art register depicted in FIG. 1, it is evident that conventional logic blocks have heretofore performed the data control functions for recirculation and new entries. In the ensuing description, binary "1" corresponds to +5 volts while binary "0" is zero volts. Taking DATA LINE 1 as a representative example, a +5 volt command signal on WRITE line 2 must coincide with a +5 volt data signal on DATA IN LINE number 1 before an output is generated by AND gate 9 and coupled to node D of the flip-flop via OR gate 11. The output of AND gate 12, in the feedback loop of this register line, remains at zero volts during the presence of the WRITE signal as a result of a zero volt level at one of its inputs, namely, the inversion of the +5 volt WRITE signal by amplifier 13. If, on the other hand, the level on DATA IN LINE number 1 had been zero volts during the WRITE time interval, a binary "0" would have been entered into the flip-flop by the concurrent presence of zero volt levels at the outputs of both gates 9 and 11.

The absence of a WRITE command, reflected by a zero volt level on WRITE line 2, holds the output of AND gate 9 at zero irrespective of the level on DATA IN LINE number 1. Under those conditions, the output of OR gate 11 follows AND gate 12. Thus, if a binary "0" is entered into the flip-flop during an immediately preceding WRITE sequence, node Q is shifted to a zero volt level, the output of AND gate 12 is fixed at zero volts, and input node D is likewise fixed at zero volts. Given these constraints, the binary "0" state remains stored irrespective of the number of clock cycles or changes at DATA IN LINE number 1, in that the written state is recirculated in synchronism with the clock signals. A WRITE command inhibits the recirculation function and enters the new binary state present on the DATA IN LINE.

Some synchronism between the clock signals and the WRITE signal are clearly required to maintain proper operation of the prior art configuration illustrated in FIG. 1. The simplest implementation is to synchronize the WRITE signal with the $\phi_1$ clock signal and ensure that the DATA IN LINE signals exist at least during the latter segment of the WRITE/$\phi_1$ signals. Since the art is replete with extensive descriptions of the considerations associated with the prior art configuration illustrated in FIG. 1, further development of techniques from the prior art is superfluous.

One clearly detracting aspect of the prior art register described above lies with its repeated use of three logic gates for each data line in the register, all joined through a pair of WRITE lines, merely to control the entry and recirculation of data already stored in the flip-flops. Considering the pervasive need for synchronous timing in computer applications, the static storage capability of D type flip-flops, and the simplicity of fabricating master-slave, D type flip-flop with FETs, the dominant detrimental feature of such registers is attributable to the multiplicity of logic gates.

Consideration has been given to the concept of gating the clock signals as a substitute for the logic controlled, data recirculation technique described hereinbefore. However, as is often the case, practical constraints introduced during the actual implementation of the circuits introduce other detracting features. For example, inserting conventionally configured logic circuits in the clock signal lines, and the inherent propagation delays such circuits introduce, significantly increases the risk of overlapping the two-phase clock signals. Furthermore, gating skews or delays often accumulate to the extent that they affect synchronous timing requirements between the register and other clock synchronized circuits in computer applications. The disastrous implications of the latter situation are, no doubt, self-evident.

Power supply voltage limitations are similarly constraining. Given the normal situation, in which a single +5 volt supply drives all the FET devices on a chip, the presence of classic series gates in the clock signal lines reduce the signal magnitude by one FET threshold for each gate stage. This is particularly detrimental when the clock signals treated by such gates are applied directly to succeeding gate electrodes of FETs within a master-slave flip-flop, e.g. signal $\phi_1$ in FIG. 2, in that the data signal transmitted through FET 3 of the flip-flop is now reduced to the extent of two thresholds from the +5 volt supply. To illustrate this point numerically, consider a typical +5 volt power supply, nominal 1.5 volt FET threshold voltages, and perfect +5 volt levels at node D and the origin of clock signal $\phi_1$. If, as suggested above, a single FET gate were inserted into the path of $\phi_1$ between its origin and the point of entry into the flip-flop of FIG. 2, the $\phi_1$ signal entering the flip-flop would be 3.5 volts (5 volts less the 1.5 volt threshold). Since FET 3 itself has a 1.5 volt threshold, a +5 volt signal at node D never reaches the input of inverter 4, but rather, is one threshold down from the voltage at the gate electrode (3.5 volts) of FET 3. Consequently, amplifier 4 is presented with 2 volts (3.5 volts minus 1.5 volts), a magnitude barely adequate to actuate the amplifier and clearly lacking any operating margin.

The present invention recognizes the deficiencies and constraints characteristically exhibited by the prior art. In practicing the invention, register complexity is reduced by utilizing a single circuit to control the entry of new data at all lines of the register. The comparatively simple D type, master-slave flip-flops, driven by a two-phase nonoverlapping clock, remain as the working elements in the register. No skews or delays are introduced into the synchronous clock. And finally, though clock gating is utilized, control is effected without degrading the amplitude of the clock signal during its progression through the gate. These and other features will become more apparent after understanding the circuit and its operation, as described and illustrated using a representative embodiment.

Figure 2:
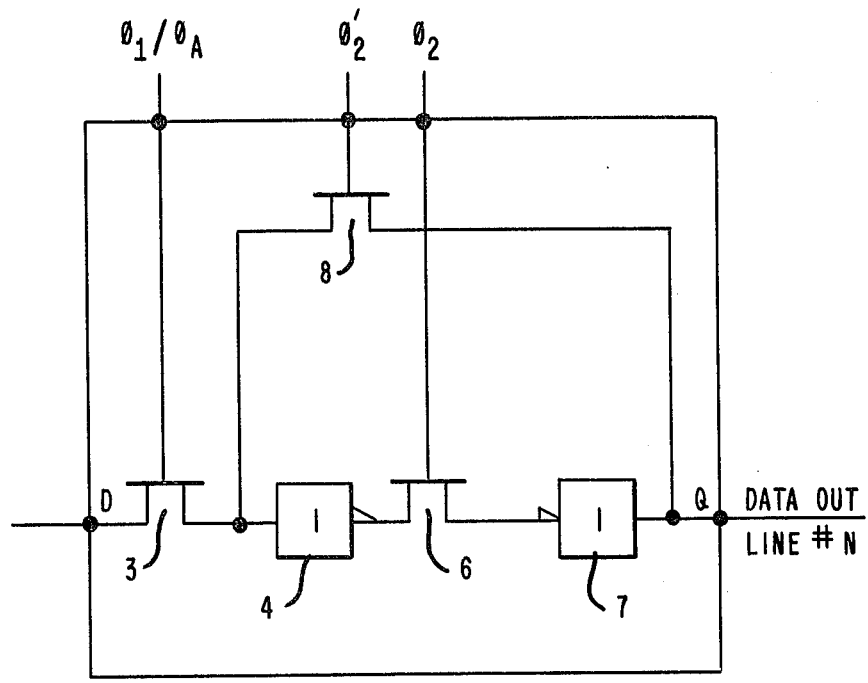
FIG. 2 schematically illustrates a D type flip-flop suitable for use with registers.
Figure 4:
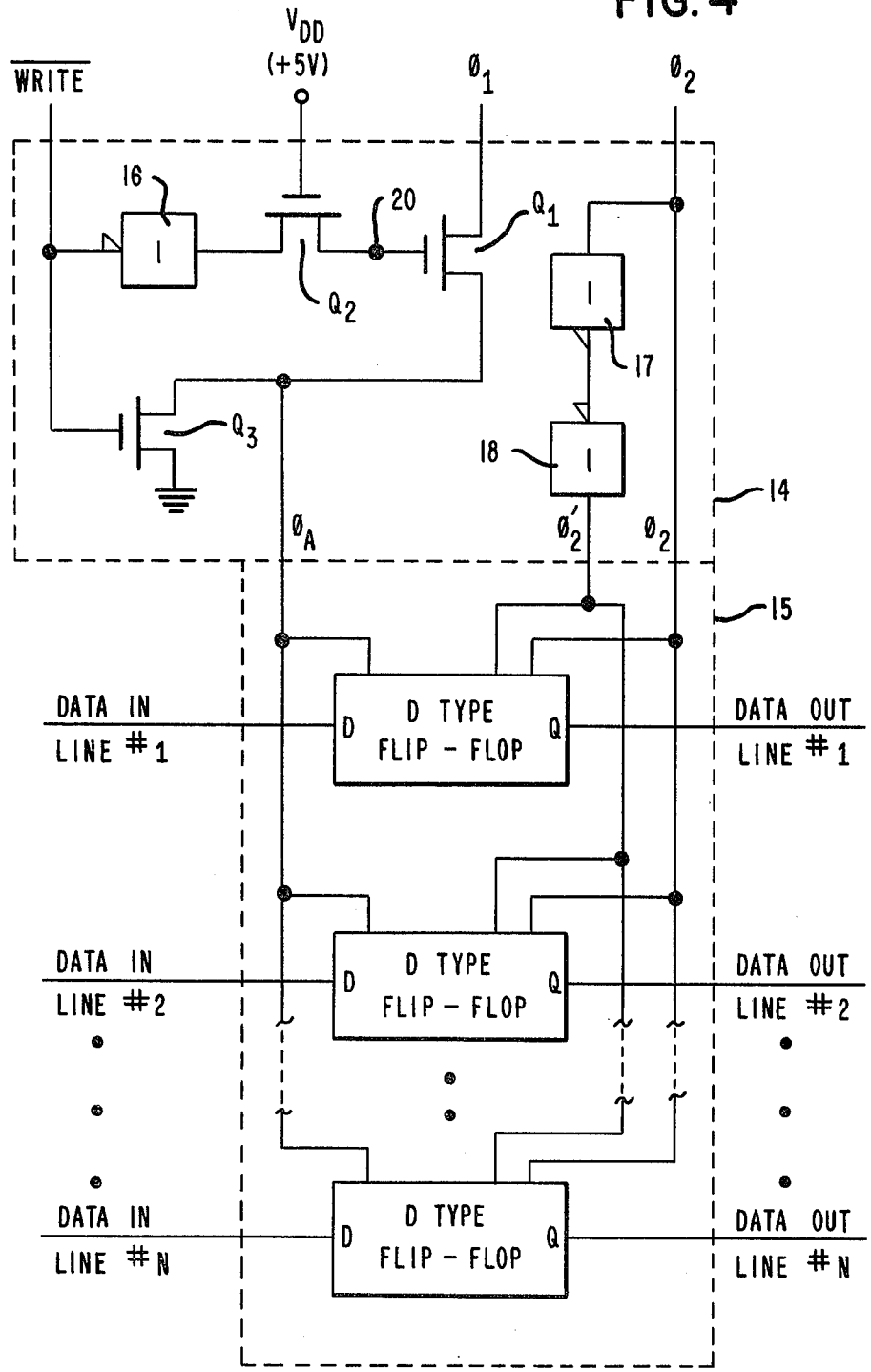
FIG. 4 schematically depicts one embodiment of the present invention.

Attention is now directed to FIG. 4 of the drawings. The schematic shows a multiple line, synchronous, static register. Within dashed line 15, there appears a bank of D type flip-flops suitable for receiving, storing and furnishing N lines of data. Coupled to the register is the control circuit segment of the register, within dashed parameter 14, for receiving and appropriately conditioning both the WRITE command signal and the two-phase nonoverlapping clock signals. For purposes of the ensuing description, the power supply, $V_{DD}$, is at +5 volts, while the $\overline{\text{WRITE}}$, master clock $\phi_1$ and slave clock $\phi_2$ signals translate abruptly between levels of substantially +5 volts and 0 volts. To the right of the block enclosed by reference numeral 14 there appear a pair of inverting amplifiers, 17 and 18, used to introduce a fixed delay in signal $\phi_2$ adequate to generate $\phi_2'$. The cascaded inverters merely illustrate the ease with which clock signal $\phi_2'$ can be generated or deleted to suit the particularities of the D type flip-flops utilized in the register. For the configuration shown, the D type flip-flop of FIG. 2 is representative.

The voltage levels and polarities in the embodiment correspond to n-channel, enhancement mode FETs having a normal threshold voltage of approximately 1.5 volts. The central element in the embodying control circuit is series pass transistor $Q_1$, with the difference between clock signals $\phi_1$ and $\phi_A$ depicting its effect on the waveforms. The series pass configuration of FET $Q_1$ permits electrical node 20 joining FETs $Q_1$ and $Q_2$ to undergo a bootstrap voltage shift from 3.5 volts, corresponding to the level set by the +5 volt power supply, to a 7.5 volt shifted amplitude. The time delay heretofore attributed to the gating of signals, in this case synchronized clock signal $\phi_1$, is also eliminated with the series pass configuration of gate FET $Q_1$. In part, this is attributed to the normally "on" state of FET $Q_1$ when clock signal $\phi_1$ commences. These and other aspects will become clearer as the invention is described further.

Figure 3:
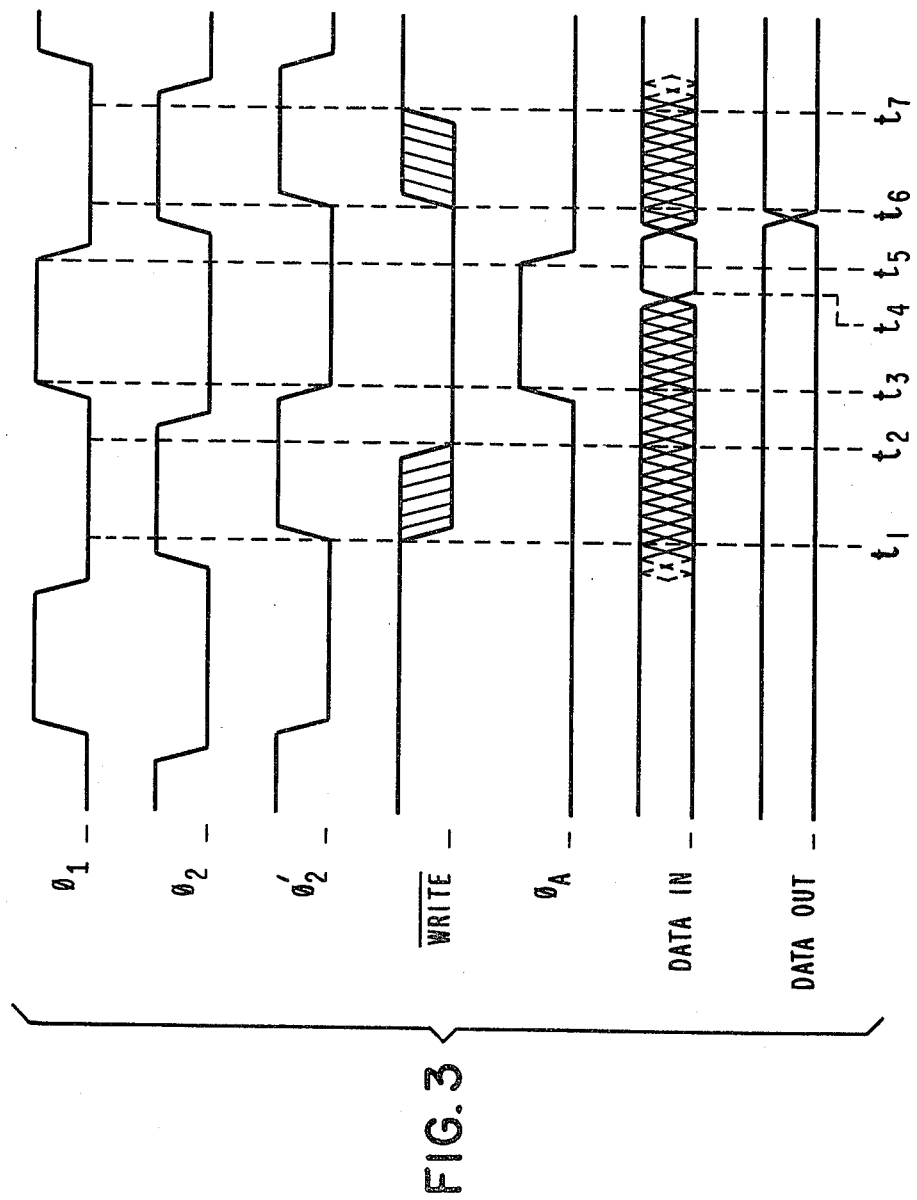
FIG. 3 presents a group of waveforms illustrating the characteristics of signals at various locations in the schematic of FIG. 4.

The plots appearing in FIG. 3 illustrate representative waveforms for the various signals designated in FIG. 4. In addition, the amplitude and pattern variations of the $\overline{\text{WRITE}}$, DATA IN and DATA OUT lines graphically depict permissible amplitude and timing characteristics. Since symbols defining the timing constraints are already illustrated on the plots using generally recognized engineering notation, their effects can readily be incorporated into the general analysis of the circuit. The composite description of the embodying circuit will rely upon FIG. 3, FIG. 4 and Table I, below.

TABLE 1

| TIME | $\phi_1$ | $\overline{\text{WRITE}}$ | $Q_3$ | $Q_2$ | NODE 20 | $\phi_A$ |
|---|---|---|---|---|---|---|
| BEFORE $t_1$ | 0V | 5V | ON | ON | 0V | 0V |
| $t_1$-$t_2$ | 0V | TO 0V | TO OFF | TO ON | TO 3.5V | 0V |
| $t_3$-$t_5$ | 5V | 0V | OFF | OFF | 7.5V (bootstrapped) | 5V |
| $t_6$-$t_7$ | 0V | TO 5V | TO ON | TO ON | TO 0V | 0V |
| AFTER $T_7$ | 0V | 5V | ON | ON | 0V | 0V |

Generally, it should be understood that the technique of the present embodiment controls the master clock signal, $\phi_1$. Consequently, voltages changes at the DATA IN lines are of no import to the register's written operation. In other words, until a master clock signal is passed to a register, the preexisting data in the static register remains fixed. Likewise, after a WRITE signal ceases, the newly entered data remains fixed.

Referring now to the first row of Table I and the waveforms plotted in FIG. 3, commence the analysis at a point in time immediately prior to $t_1$. Briefly summarizing the voltage conditions, one notes that $\phi_1$ is at 0 volts, $\phi_2$ is at +5 volts, $\phi_2'$ is transitioning to +5 volts, the WRITE command is low, so that $\overline{\text{WRITE}}$ is at +5 volts, $\phi_A$ is at 0 volts, the DATA IN LINES are free to translate at will, and the DATA OUT LINES remain unaltered. Under these conditions, FET $Q_3$ is conducting to hold line $\phi_A$ to a clean 0 volts, node 20 is at 0 volts by way of the conductive path through FET $Q_2$ to inverting amplifier 16. The absence of a conductive path through FET $Q_1$ prohibits master clock signals $\phi_1$ from reaching line $\phi_A$.

Next, consider the interval of time between $t_1$ and $t_2$, by referring to the Table, the waveforms and the circuit schematic. Again, summarizing the voltage conditions, $\phi_1$, $\phi_2$, $\phi_2'$, $\phi_A$, DATA IN and DATA OUT remain substantially unchanged from the prior time period. As embodied, however, the invention contemplates a transition in the $\overline{\text{WRITE}}$ command during that interval from its previous +5 volt level to 0 volts. Typically, in a synchronous system, the $\overline{\text{WRITE}}$ signal will be generated by and follow immediately after the low to high transition of signal $\phi_2$, i.e. consistent with the time interval between $t_1$ and $t_2$. Soon after the transition of the $\overline{\text{WRITE}}$ signal, FET $Q_3$ turns off and FET $Q_2$ conducts +3.5 volts to node 20 and the gate electrode of $Q_1$. The 3.5 volts represents the 5 volts from amplifier 16 reduced by the 1.5 volt threshold of FET $Q_2$. At this time FET $Q_1$ is biased to form a conductive path between its source and drain electrodes, effectively coupling any clock signals on the line $\phi_1$ directly to line $\phi_A$.

The next succeeding interval of time encompasses the period between time $t_3$ and $t_4$. Clock signals $\phi_2$ and $\phi_2'$ are at 0 volts, while the $\overline{\text{WRITE}}$ signal remains at 0 from prior time $t_2$. The characteristics of the signals on DATA IN and DATA OUT lines will be described later. In contrast to the voltage states at time $t_2$, synchronous clock signal $\phi_1$ now has risen to +5 volts, drawing with it clock signal $\phi_A$ to a voltage level of comparable value with a negligible time delay.

To consider the action of transistors $Q_1$ in the period just prior to $t_3$, and the implications thereof, it must be recognized that FETs $Q_1$ and $Q_2$ exhibit intrinsic capacitive effects which are small yet not negligible. When the drain/source electrode and previously formed channel through FET $Q_1$ receives a +5 volt, $\phi_1$ clock pulse, the capacitive coupling to the gate electrode of $Q_1$, node 20, bootstraps the voltage at the gate electrode to a level significantly greater than the preexisting 3.5 volts. Thereby, the coupling of a voltage through the gate of FET $Q_1$ coincident with the rise in clock pulse 100 $_1$ cuts off FET $Q_2$ and raises node 20 from its prior 3.5 volt level to approximately 7.5 volts. Note that the 7.5 volt level on the gate electrode of FET $Q_1$ is more than adequate to overcome the 1.5 volt threshold and conduct the full 5 volts of clock signal $\phi_1$ through to $\phi_A$. The preexisting conductive path through FET $Q_1$, in conjunction with the minimum capacitive loading exhibited through FET $Q_2$ by its rapid cutoff, significantly reduces the delay of clock pulse $\phi_1$ in its progression to $\phi_A$.

During the following interval of interest, $t_6$ to $t_7$, the data entered into each flip-flop during the master clock pulse $\phi_A$ is transferred into the slave section by the sequence of $\phi_2$ and $\phi_2'$. Cyclic reappearance of the latter clock signals refreshes the state of the flip-flop. As is illustrated by the waveforms in FIG. 3, the transition into the slave section of the flip-flop is evidenced by a change in the DATA OUT lines. This same interval of time is appropriate for effecting a removal of the WRITE command, illustrated in FIG. 3 by the conventional showing of multiple $\overline{\text{WRITE}}$ signal transistion lines between the 0 volt level and the +5 volt level.

After time $t_7$ the states of the individual active devices in control circuit segment 14 revert to the states present before time $t_1$.

A further characterization of the DATA IN and DATA OUT signals plotted in FIG. 3 can be developed using the D type flip-flop embodied in FIG. 2. In that particular case, analysis shows that inverting amplifier 4 must complete any transition to a new data state before gating FET 3 decouples node D by the presentation of a 0 voltage on master clock line $\phi_4$. Namely, the state of the DATA IN line must stabilize at time $t_4$ if inverter 4 requires an interval no greater than that between $t_4$ and $t_5$ to transition and stabilize. The binary state of the DATA IN line is again free to vary after gating FET 3 is cut off. Both conditions are illustrated in FIG. 3 by the crossed transition patterns extending either direction of the critical period. Again, in the context of FIG. 2, the DATA OUT signal transitions only after the onset of slave clock signal $\phi_2$. This transition is shown to occur in FIG. 3 immediately preceding the time $t_6$.

The embodying asynchronous register control circuit described herein is a significant improvement over the known art. No longer is a composite group of logic gates required for each line of the register. Rather, binary data is entered by the selective application of master clock pulses to a bank of D type, master-slave flip-flops. Furthermore, though entry of register data is controlled by selective gating of the clock signal through a FET, the series pass configuration of the FET, as well as the bootstrap circuitry coupled thereto, introduces substantially no delay to the synchronization pulse while conveying substantially the full voltage amplitude of that pulse. In terms of practical considerations, these features are also implemented with a circuit having a very low active component count and comparatively low power dissipation.

We claim:

1. An electronic circuit for controlling data in a bank of D-type, master-slave flip-flops synchronized to a multiple phase clock, comprising:
    a first field effect transistor having its drain electrode connected to receive a first phase signal from said clock, having its source electrode connected to said bank of flip-flops to control the entry of data into said bank of flip-flops, and having a gate electrode;
    a bootstrapping field effect transistor having its source electrode connected to said gate electrode of said first field effect transistor, having its drain electrode connected to a source of write command signals, and having its gate electrode connected to a source of voltage which is substantially identical to said write command signals in magnitude; and
    means for connecting said source electrode of said first field effect transistor to ground potential whenever a write command signal is absent.

2. The circuit recited in claim 1, wherein said multiple phase clock generates two phase signals nonoverlapping in time.

3. The circuit recited in claim 2, wherein the onset of said write command signals precedes in time the onset of said first phase signals.

4. The circuit recited in claim 3, wherein said field effect transistors are enhancement mode devices.

* * * * *